United States Patent
Dellis et al.

(10) Patent No.: US 11,467,228 B2
(45) Date of Patent: Oct. 11, 2022

(54) MILLIMETER WAVE MAGNETIC SENSOR

(71) Applicant: Texas Instruments Incorporated, Dallas, TX (US)

(72) Inventors: Argyrios Dellis, McKinney, TX (US); Juan Alejandro Herbsommer, Allen, TX (US); Adam Joseph Fruehling, Garland, TX (US); Bichoy Waguih Bahr, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 156 days.

(21) Appl. No.: 17/095,271

(22) Filed: Nov. 11, 2020

(65) Prior Publication Data

US 2022/0146601 A1    May 12, 2022

(51) Int. Cl.
| | |
|---|---|
| *G01R 33/02* | (2006.01) |
| *G01R 33/04* | (2006.01) |
| *G01R 15/20* | (2006.01) |
| *G01R 15/18* | (2006.01) |
| *G01R 33/07* | (2006.01) |
| *G01R 33/09* | (2006.01) |

(52) U.S. Cl.
CPC ........... *G01R 33/04* (2013.01); *G01R 15/185* (2013.01); *G01R 15/207* (2013.01); *G01R 33/02* (2013.01); *G01R 33/07* (2013.01); *G01R 33/093* (2013.01); *G01R 33/09* (2013.01)

(58) Field of Classification Search
CPC .... G01R 33/04; G01R 15/185; G01R 15/207; G01R 33/02; G01R 33/07; G01R 33/093; G01R 33/09
USPC ............... 324/51, 55, 200, 227, 228, 244
See application file for complete search history.

(56) References Cited

U.S. PATENT DOCUMENTS

| | | |
|---|---|---|
| 9,529,334 B2 | 12/2016 | Herbsommer et al. |
| 9,778,288 B2 | 10/2017 | Polley et al. |
| 10,082,527 B2 | 9/2018 | Polley et al. |
| 10,754,302 B2 | 8/2020 | Herbsommer et al. |
| 2019/0204787 A1 | 7/2019 | Herbsommer et al. |
| 2019/0204788 A1 | 7/2019 | Dellis et al. |
| 2020/0166404 A1 | 5/2020 | Fruehling et al. |

(Continued)

OTHER PUBLICATIONS

"How Atomic Magnetometers Work", MFAM Magnetometer by Geometries, available at http://mfam.geometrics.com/atomimagnetomet. html on Feb. 5, 2020, pp. 1 of 1.

(Continued)

*Primary Examiner* — Raul J Rios Russo
(74) *Attorney, Agent, or Firm* — Michael A. Davis, Jr.; Charles A. Brill; Frank D. Cimino

(57) ABSTRACT

In described examples, a magnetic sensor includes a waveguide that encapsulates dipolar molecules. A mm-wave electromagnetic field is launched into the waveguide, travels through the dipolar molecules, and is then received after passing through the dipolar molecules. The frequency of the mm-wave electromagnetic signal is swept across a range that includes an intrinsic quantum rotational state transition frequency (Fr) for the dipolar molecules. Absorption peaks in accordance with the Zeeman effect are determined. A strength of a magnetic field affecting the magnetic sensor is proportional to a difference in the frequencies of the absorption peaks.

20 Claims, 12 Drawing Sheets

(56) References Cited

U.S. PATENT DOCUMENTS

2020/0272107 A1* 8/2020 Herbsommer ............ H03L 7/26
2020/0387115 A1* 12/2020 Herbsommer ......... H03B 17/00
2021/0199702 A1* 7/2021 Dellis .................... G01N 22/00

OTHER PUBLICATIONS

Tushna Commissariat, "Atomic Magnetometer is Most Sensitive Yet", Physics World, available at https://physicsworld.com/a/atomic-magnetometer-is-most-sensitive-yet/ on Feb. 5, 2020, pp. 1-3.
"Zeeman Effect", Wikipedia, available at https://.wikipedia.org/wiki/Zeeman_effect on Oct. 10, 2019, pp. 1-10.

* cited by examiner

MILLIMETER WAVE MAGNETIC SENSOR

TECHNICAL FIELD

This relates to a millimeter wave magnetic sensor.

BACKGROUND

In a magnetic field based non-contact current sensor, current through a low-resistance metal trace creates a magnetic field that can be sensed by a magnetic sensor. The intensity of the created magnetic field may be proportional to the current flowing through the trace. Many types of magnetometers are useful for measuring a magnetic field; see, e.g. "Magnetometer", Wikipedia, as of Mar. 5, 2020. A Hall device is one type of magnetometer that is commonly used for current sensing applications.

A fluxgate magnetometer is another type of magnetometer that is commonly used for current sensing applications. Fluxgate magnetometers (FGM) were invented in the 1930s by Victor Vacquier at Gulf Research Laboratories. In essence, a fluxgate magnetometer is a small, magnetically susceptible core wrapped by two coils of wire. An alternating electric current is passed through one coil, driving the core through an alternating cycle of magnetic saturation, such as magnetized, unmagnetized, inversely magnetized, unmagnetized, magnetized, and so forth. This constantly changing field induces an electric current in the second coil, and this output current is measured by a detector. In a magnetically neutral background, the input and output currents will match. However, when the core is exposed to a background field, it will be more easily saturated in alignment with that field and less easily saturated in opposition to it. Accordingly, the alternating magnetic field, and the induced output current, will be out of step with the input current. The extent to which this happens will depend on the strength of the background magnetic field. The current in the output coil may be integrated over a period of time to yield an analog voltage proportional to the magnetic field.

Atomic magnetometers work by detecting how the energy levels of atoms are modified by an external magnetic field. This is a quantum effect in which the magnetic spin states in an atom split in the presence of an external magnetic field. This effect is known as the Zeeman effect. This interaction between the atomic magnetic moment and external field is used to measure the field. This is normally done by using a pump laser to "polarize" the atoms by populating specific spin states, while a probe laser measures the spin precession, which is proportional to the magnetic field. Typical atomic magnetometers are complex, unreliable and expensive.

An atomic clock is a clock device that uses a quantum transition frequency in the microwave, optical, or ultraviolet region of the electromagnetic spectrum of atoms as a frequency standard for its timekeeping element. Atomic clocks are the most accurate time and frequency standards known and are used as primary standards for international time distribution services, to control the wave frequency of television broadcasts, and in global navigation satellite systems such as GPS.

The band of radio frequencies in the electromagnetic spectrum from 30 to 300 gigahertz (GHz) is designated as "extremely high frequency" (EHF) by the International Telecommunication Union (ITU). It lies between the super high frequency band (3-30 GHz) and the far infrared band (0.1-10 THz). Radio waves in this band have wavelengths from ten to one millimeter, giving it the name millimeter band or millimeter wave, sometimes abbreviated "MMW" or "mmW."

SUMMARY

In described examples, a magnetic sensor includes a waveguide that encapsulates dipolar molecules. A mm-wave electromagnetic field is launched into the waveguide, travels through the dipolar molecules, and is then received after passing through the dipolar molecules. The frequency of the mm-wave electromagnetic signal is swept across a range that includes an intrinsic quantum rotational state transition frequency (Fr) for the dipolar molecules. Absorption peaks in accordance with the Zeeman effect are determined. A strength of a magnetic field affecting the magnetic sensor is proportional to a difference in the frequencies of the absorption peaks.

DETAILED DESCRIPTION

Figure 1A:
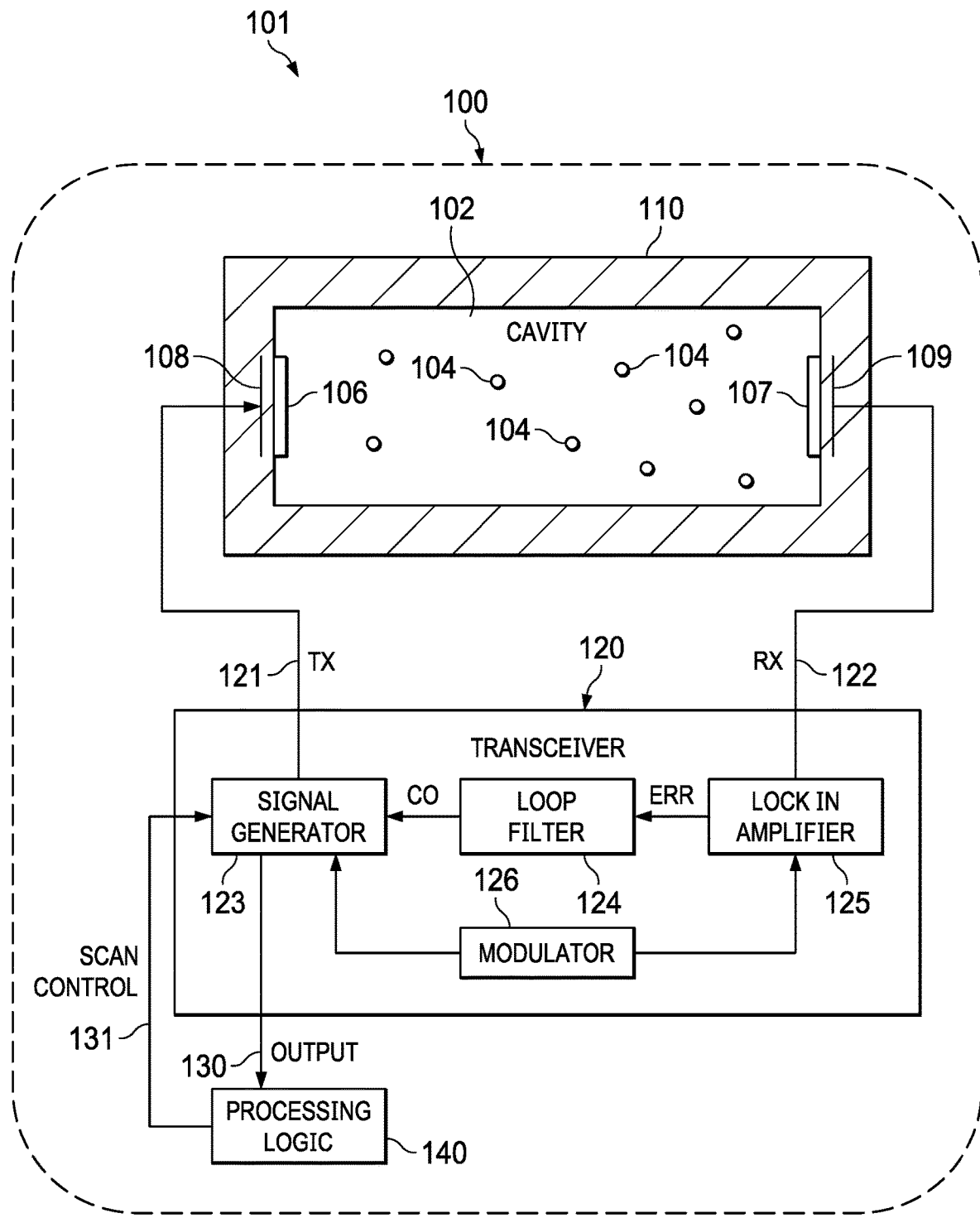
FIGS. 1A, 1B illustrate an example integrated circuit that includes a hermetically sealed chip-scale cavity, which is used as a spectroscopy cavity to operate as a magnetic sensor.

In the drawings, like elements are denoted by like reference numerals for consistency.

The Zeeman effect, named after the Dutch physicist Pieter Zeeman, is the effect of splitting of a spectral line into several components in the presence of a static magnetic field. It is analogous to the Stark effect, the splitting of a spectral line into several components in the presence of an electric field. Because the distance between the Zeeman sub-levels is a function of magnetic field strength, this effect is useful to measure magnetic field strength. The Zeeman effect is described at "Zeeman Effect," Wikipedia.

A typical atomic magnetometer works by detecting how the energy levels of atoms are modified by an external magnetic field according to the Zeeman effect. This interaction between the atomic magnetic moment and external field is used to measure the field. This is normally done with a pump laser to "polarize" the atoms by populating specific spin states, while a probe laser measures the spin precession, which is proportional to the magnetic field. Typical atomic magnetometers are complex, unreliable and expensive.

As described hereinbelow, examples of an integrated circuit (chip) scale magnetic sensor based on the Zeeman effect use a mm-wave electric field to interrogate dipolar molecules that are contained within a chip-scale cavity formed within the integrated circuit. This solution provides a chip-scale magnetic sensor that is less complex, more reliable, and lower cost than typical atomic magnetometers.

The sensitivity of this chip-scale magnetic sensor depends on the absorption length of the chip-scale cavity and the gyro-magnetic ratio of a selected dipolar molecule gas that is placed within the chip-scale cavity. The chip-scale cavity configuration and the dipolar molecules can be chosen based on requirements of a particular customer or target application, such as: sensitivity, sensor footprint, cost, etc. Various examples of chip-scale magnetic sensors described hereinbelow are insensitive to temperature fluctuations. Various examples of chip-scale magnetic sensors described hereinbelow are configured to provide increased resolution, low power, and/or common mode rejection.

FIG. 1A is a block diagram of an example magnetic sensor 100 that is fabricated as part of integrated circuit 101. Magnetic sensor 100 includes a hermetically sealed chip-scale cavity 102 that is useful as a spectroscopy cavity to operate as a magnetic sensor. Spectroscopy is the study of the interaction between matter and electromagnetic radiation. Spectroscopy originated through the study of visible light dispersal according to its wavelength by a prism. Spectroscopy includes the study of any interaction with radiative energy as a function of its wavelength or frequency. Spectroscopic data are often represented by an emission spectrum, which is a plot of the response of interest as a function of wavelength or frequency. Spectra of atoms and molecules often are represented by a series of spectral lines, each one representing a resonance between two different quantum states.

Magnetic sensor 100 operates in a similar manner as a millimeter wave atomic clock that generates a frequency output signal 130 based on the frequency of quantum rotation of selected dipolar molecules 104 contained in hermetically sealed cell 102 formed in semiconductor material 101. The frequency output signal produced by quantum rotation of the selected dipolar molecules is unaffected by circuit aging and does not vary with temperature or other environmental factors.

Magnetic sensor 100 includes a transceiver 120 with a transmit output 121 for providing a millimeter wave electrical transmit signal (TX) to a spectroscopy device 110, as well as a receiver input 122 for receiving an electrical input signal (RX) from the spectroscopy device 110. Spectroscopy cavity 102 does not require optical interrogation, and instead operates through electromagnetic interrogation via the transmit and receive signals (TX, RX) provided by the transceiver 120.

Figure 1B:
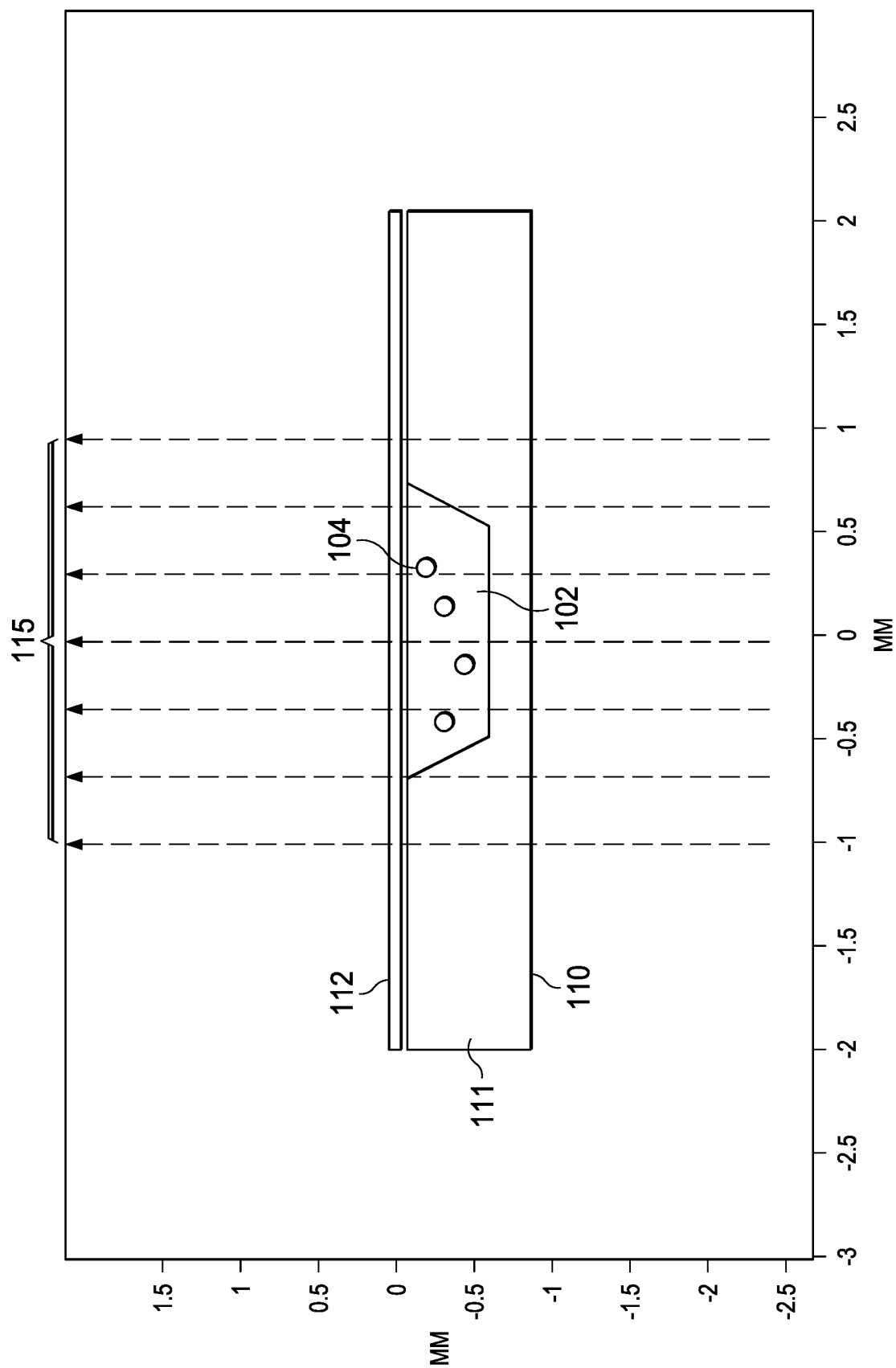

FIG. 1A illustrates a top view of spectroscopic cavity 102, while FIG. 1B illustrates an end view of spectroscopic cavity 102. Cavity 102 is formed in substrate 111 using known or later developed semiconductor fabrication techniques. In this example, a glass layer 112 is bonded to the substrate 111 to form a hermetically sealed cavity 102 that is filled with a gas containing dipolar molecules 104. An example of a spectroscopy cell in a millimeter wave atomic clock (and methods of fabricating it) is described in U.S. Pat. No. 9,529,334, issued Dec. 27, 2016, which is hereby incorporated fully herein by reference.

Sealed cell 102 includes a conductive interior cavity surface, as well as first and second non-conductive irises 106 and 107 formed in the interior cavity surface for providing an electromagnetic field entrance and an electromagnetic field exit, respectively. In one example, irises 106, 107 magnetically couple into the TE10 mode of the cell 102. In other examples, irises 106, 107 excite higher order modes. Irises 106, 107 are non-conductive regions formed in the conductive interior cavity surface and provide a passage to allow a mm-wave electric field to propagate into or out of the cavity. First and second conductive coupling structure 108, 109 are formed on an outer surface of cell 102 proximate the first and second non-conductive irises 106 and 107, respectively. The coupling structures 108, 109 are antenna(s) and may include a conductive strip formed on a surface of one of the substrates forming the cell 102. Coupling structure 108 overlies the non-conductive iris 106 for providing an electromagnetic interface to couple an electromagnetic field into cell 102 from the transmit signal TX from the transceiver output 121. Similarly, coupling structure 109 overlies the non-conductive iris 107 for providing an electromagnetic interface to couple an electromagnetic field from cell 102 to the transceiver RX input 122. The proximate location of the conductive coupling structures 108, 109 and the corresponding non-conductive irises 106, 107 provide electromagnetic transmissive paths through an upper substrate 112, which is an electromagnetic transmissive material that seals cavity 102. Spectroscopy cavity 102 functions as a waveguide for a mm-wave electric field that propagates from transmit antenna 108 to receive antenna 109.

Materials that are magnetic, such as nickel and iron or materials with high magnetic permeability, should not be used in the construction of cell 110. The reason is that such magnetic material could seriously distort the magnetic field distribution and affect the magnetic field sensed by the gas. If the magnetic field distortion is severe, a systematic error will happen because the "real" target magnetic field will be distorted, and the field detected by the gas in the cell may be significantly smaller than the target magnetic field value.

In this example, transceiver circuit 120 is implemented on an integrated circuit (IC) die, to which the spectroscopy device 110 is electrically coupled for transmission of the TX signal via the output 121 and for receipt of the RX signal via the input 122. Transceiver 120 is configured to provide (when powered) a mmW electrical output signal TX to the first conductive coupling structure 108 for coupling an electromagnetic field to the interior of the cell 102, and further configured to receive the alternating electrical input signal RX from the second conductive coupling structure 109 representing the electromagnetic field received from the cell 102. The transceiver circuit 120 is configured to selectively adjust the frequency of the mmW output signal TX to interrogate the dipolar molecules 104 within cell 102 at a frequency that substantially maximizes the molecular absorption through rotational state transitions.

In an optional clock mode of operation, output signal 130 is provided as an output for use by another device or system. In this example, the frequency of output signal 130 is reduced by a frequency divider circuit with a divisor N from the frequency of the TX output signal 121. In another example, the output signal frequency may be the same as TX output signal 121. The output signal from the signal generator 123 can be provided to other circuitry, such as frequency dividers and other control circuits requiring use of a clock.

In this example, the transceiver 120 includes a signal generator 123 having an output 121 electrically coupled to the first conductive coupling structure 108 for providing the mmW output signal TX, and an output for providing the output signal 130 at the corresponding transmit output frequency. Signal generator 123 is modulated by a modulator 126 to provide a base frequency controlled TX signal that is swept across a particular frequency range from below to past the intrinsic quantum rotational state transition frequency for the dipolar gas in cell 102 (e.g., 183.31 GHz for water). Modulator 126 modulates the frequency of the interrogation signal provided by the signal generator 123. The modulation frequency ranges, for example, between 10 to 50 KHz. After the signal passes through the gas cell, it is received by a lock-in amplifier 125, via an input 122 configured to receive the RX signal from receive antenna 109. Generally, lock-in amplifier 125 uses the signal from modulator 126 to measure the RX signal at the same modulation frequency provided by modulator 126. In this way, lock-in amplifier 125 can reject noise outside the modulation frequency and thereby reduce the noise from the system.

In one example, the signal generator 123 initially sweeps the transmission output frequency through a band that includes the quantum frequency of the cell 102. Examples include transitioning upward from an initial frequency below the suspected quantum frequency, or initially transitioning downward from an initial frequency above the suspected quantum frequency, or other suitable sweeping technique or approach. In one example, the band is selected to be in a range of 10 to 50 MHz around Fr, depending on the range of magnetic fields that is to be detected.

In more detail, the TX signal may be a sinusoid, although other periodic oscillating signals also may be used, so long as such signal includes a Fourier component in the frequency of interest. Under feedback control, signal generator 123 also provides the output signal 130. The RX signal represents an amount of the originally transmitted signal TX that passes through cell 102 and contains the information of the absorption of the dipolar gas at the quantum rotations transition frequency. The molecular absorption can be quite small, on the order of less than 1%, in many cases. The signal generator 123 hunts for this dip and locks onto it. In response, lock-in amplifier 125 provides a signal that is the first derivative of the signal as it is swept in frequency. Consequently, at the frequency corresponding to the quantum rotational molecular transition, the first derivative is zero, and the error signal ERR is zero. At frequencies different from the quantum rotational transition, the signal ERR is not zero and provides a correction to a loop filter 124, allowing it to "lock" the clock to the quantum transition frequency. This apparatus also filters out noise as detected by reference to the modulation frequency provided by modulator 126. In one example, lock-in amplifier 125 provides the error signal ERR as an in-phase output, and the error signal ERR is used as an input by loop filter 124 (or controller circuit) for providing a control output signal CO to signal generator 123. Such feedback selectively adjusts the TX output signal frequency, following an initial sweep, to ultimately maintain this frequency at a peak absorption frequency of the dipolar molecular gas inside the sealed interior of cell 102, with that maintained frequency providing a stable output signal 130. In some examples, the RF power of the TX and RX loop is controlled to avoid or mitigate stark shift effects (frequency shifts in response to quantum transition produced by the presence of an electric field).

The rotational quantum frequency of the dipolar molecule gas in the vapor cell 102 is generally stable with respect to time (does not degrade or drift over time) and is largely independent of temperature and several other variables.

In steady state operation, the lock-in amplifier 125 and the loop filter 124 maintain the transmitter frequency at the peak absorption frequency of the cell gas 102. In one example, the loop filter 124 provides proportional-integral-derivative (PID) control using a derivative of the frequency error as a control factor for lock-in detection and closed loop regulation. At the bottom of the null in a transmission coefficient curve caused by the absorption dip, the derivative is zero, and the loop filter 124 provides the derivative back as a direct current (DC) control output signal CO to the signal generator 124. This closed loop operates to keep the signal generator transmission output frequency at the peak absorption frequency of the cell gas, using lock-in differentiation based on the RX signal received from the cell 102.

Processing logic 140 is configured to receive output signal 130, which indicates the frequency of a detected absorption peak. Processing logic 140 provides scan control signal 131, which causes signal generator to proceed with a scan sequence to detect absorption peaks. By determining the frequency of each detected absorption peak, processing logic 140 can determine the strength of a magnetic field that is affecting spectroscopic cell 110.

System 100 may be fabricated on a single integrated circuit (IC) as a system on a chip (SoC), for example. Alternatively, packaged magnetic field spectroscopy cell 110 may be packaged in a single IC and interconnected with other ICs that contain transceiver 120, processing logic 140, and other system logic (not shown) that uses the magnetic field strength information determined by processing logic 140.

Figure 2:
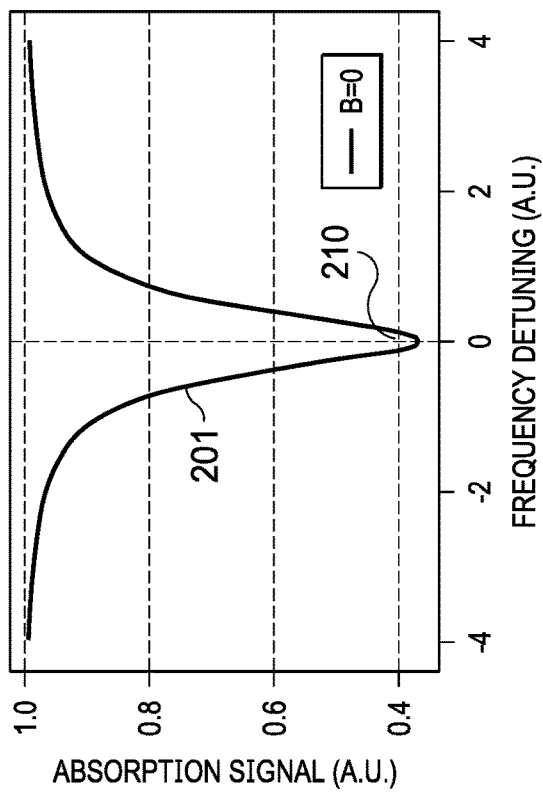
FIG. 2 is a plot of signal strength of an absorption signal vs frequency, without a magnetic field present.

FIG. 2 is a plot of signal strength of absorption signal strength vs frequency, while the magnetic sensor 100 of FIG. 1A operates without the presence of a magnetic field. As described hereinabove, transceiver 120 will lock onto a frequency to keep the signal generator transmission output frequency at the peak absorption frequency of the cell gas, using lock-in differentiation based on the RX signal received from the cell 102. In this example, the absorption signal dip on plot line 201 indicated at 210 is the target frequency for lock-in amplifier 125 (FIG. 1A). This target frequency is referred to as the intrinsic quantum rotational state transition frequency (Fr) for the dipolar molecules that are encapsulated within the waveguide. The target frequency is also referred to herein as "v0" (Greek letter nu).

In this example, the scale on the frequency axis is in "arbitrary units (a.u.)." As described above, for an example that uses water as the dipolar molecule gas, the absorption dip occurs at a frequency of 183.31 GHz. Similarly, the scale on the absorption signal axis is also given in "arbitrary units (a.u.)." The actual signal strength magnitude depends on the design of transceiver 120 and where the absorption signal is monitored, such as before or after it is amplified in lock-in amplifier 125, and it may be in units of millivolts or microvolts for example.

Figure 3:
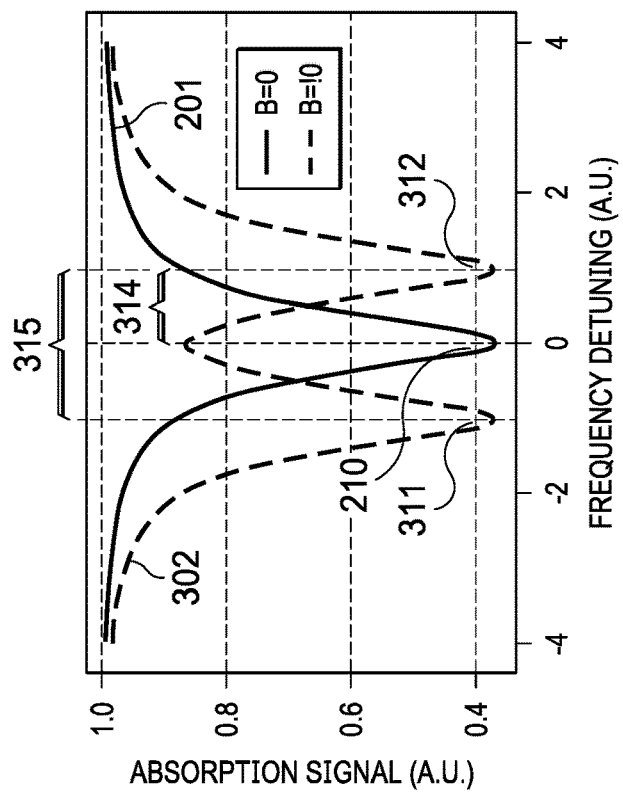
FIG. 3 is a plot of signal strength of an absorption signal vs frequency, with a magnetic field present.

FIG. 3 is a plot of signal strength of an absorption signal strength vs frequency while the magnetic sensor 100 of FIG. 1A operates within the presence of a magnetic field. Referring to FIG. 1B, a static magnetic field represented by flux lines 115 is acting on spectroscopic cavity 102. In one example, magnetic field 115 may have a field strength of 1 pT (picotesla), for example. Such a high sensitivity may be achieved using a dipolar gas with a sufficient gyromagnetic ratio. Typical magnetometers are not able to detect such low magnetic fields. Applications for sensing such low magnetic fields include contactless EKG or contactless brain wave detectors, for example.

As described hereinabove, the Zeeman effect results in the splitting of a spectral line into several components in the presence of a static magnetic field. The distance between the Zeeman sub-levels is a function of magnetic field strength. The sensitivity of the magnetic sensor to the magnetic field depends on the SNR and Q.

In this example, plot line 201 illustrates operation of magnetic sensor 100 (FIG. 1) without magnetic field influence, so the magnetic flux density B=0. Plot line 302 illustrates operation of magnetic sensor 100 in the presence of a magnetic field where the magnetic flux density B is not equal to zero. According to the Zeeman effect, two absorption signal peaks exist, indicated at 311 and 312, which are centered around the absorption signal peak indicated at 210 when the magnetic field strength is zero. In this example, absorption peaks 210, 311, and 312 coincide with a maximum amount of absorption to create minimas in the absorption signal. A difference 314 between the frequency ($\Delta v$) of peak 210 and peak 312 is proportional to the strength of a magnetic field that exists at the spectroscopy cavity 110 (FIG. 1). Similarly, the amount of frequency shift 315 between the frequency of peak 311 and peak 312 is also proportional to the strength of a magnetic field that exists at the spectroscopy cavity 110.

Expression (1) illustrates a relationship between electromagnetic field strength and frequency sensitivity. In expression (2), a g-factor (also called g value or dimensionless magnetic moment) is introduced into expression (1) as a dimensionless quantity that characterizes the magnetic moment and angular momentum of an atom, a particle or nucleus. In essence, it is a proportionality constant that relates the observed magnetic moment $\mu$ of a particle to its angular momentum quantum number and a unit of magnetic moment, which is usually the Bohr magneton or nuclear magneton. The minimum change of the magnetic field that can be measured is given by expression (3), where v0 is the center frequency such as at peak 210 in FIG. 3, and $\Delta vB$ is the frequency shift due to the magnetic field such as frequency shift 315 in FIG. 3.

$$\frac{\Delta v_B}{v_0} = \text{Frequency Sensitivity} \quad (1)$$

$$\frac{\mu_N g \Delta B}{h} = v_0 \times (\text{Frequency Sensitivity}) \quad (2)$$

$$\Delta B = \frac{v_0}{(\mu_N g / h)} \times (\text{Frequency Sensitivity}) \quad (3)$$

As shown in expression (3), a larger value of "g" allows a smaller minimum change in magnetic field to be sensed. Example candidate molecules with a relatively large g are illustrated in Table 1.

TABLE 1

| magnet moment g of various molecules | | |
|---|---|---|
| molecule | g | Natural frequency |
| CO | 0.26 | 115 GHz |
| SO2 | 0.34 | 69 GHz |
| O3 | 1.53 | 42 GHz |
| HCN & DCN | 0.09 | 88.63 GHz |

Thus, performance and sensitivity of a magnetic sensor, such as magnetic sensor 100 (FIG. 1), is affected by the electric dipolar moment and the gyromagnetic ratio of the gas that is enclosed in the cavity. The gyromagnetic ratio of a particle or system is the ratio of its magnetic moment to its angular momentum. Its SI unit is the radian per second per tesla. The term "gyromagnetic ratio" is often used as a synonym for a different but closely related quantity, the g-factor. The g-factor, unlike the gyromagnetic ratio, is dimensionless.

A gas that has a higher electrical dipolar moment is more responsive to the mm-wave EM signal, which will result in the detection of a decent absorption dip. As the electric dipolar moment increases, the absorption peak increases, which results in a better SNR. This will increase the precision and sensitivity of example magnet sensor 100. The separation between the Zeeman levels for a given magnetic field is proportional to gyromagnetic ratio. As the gyromagnetic ratio increases, the separation widens between the Zeeman levels, which increases the sensitivity of the magnetic sensor.

Referring again to Table 1, hydrogen cyanide gas has a g-factor of 0.09. In an example, use of a gas/vapor that has a g-factor of at least 0.075 produces a useful magnetic sensor.

Magnetic field sensitivity can be increased by increasing SNR of the spectroscopy cavity or configuring the cavity to produce multi-pass operation. Example spectroscopy cells that can provide increased SNR or perform multi-pass operation are described hereinbelow with reference to FIGS. 4-8

In an example magnetic sensor using a large g molecule in a spectroscopy cavity having a high SNR and good Q, a magnetic sensitivity of approximately 1 nT (nanotesla) may be achieved. For comparison, a typical Hall sensor may have a sensitivity of only 130 nT @ 1 Hz, while a well-designed fluxgate sensor may have a sensitivity of 1.5 nT @ 1 Hz.

Figure 4:
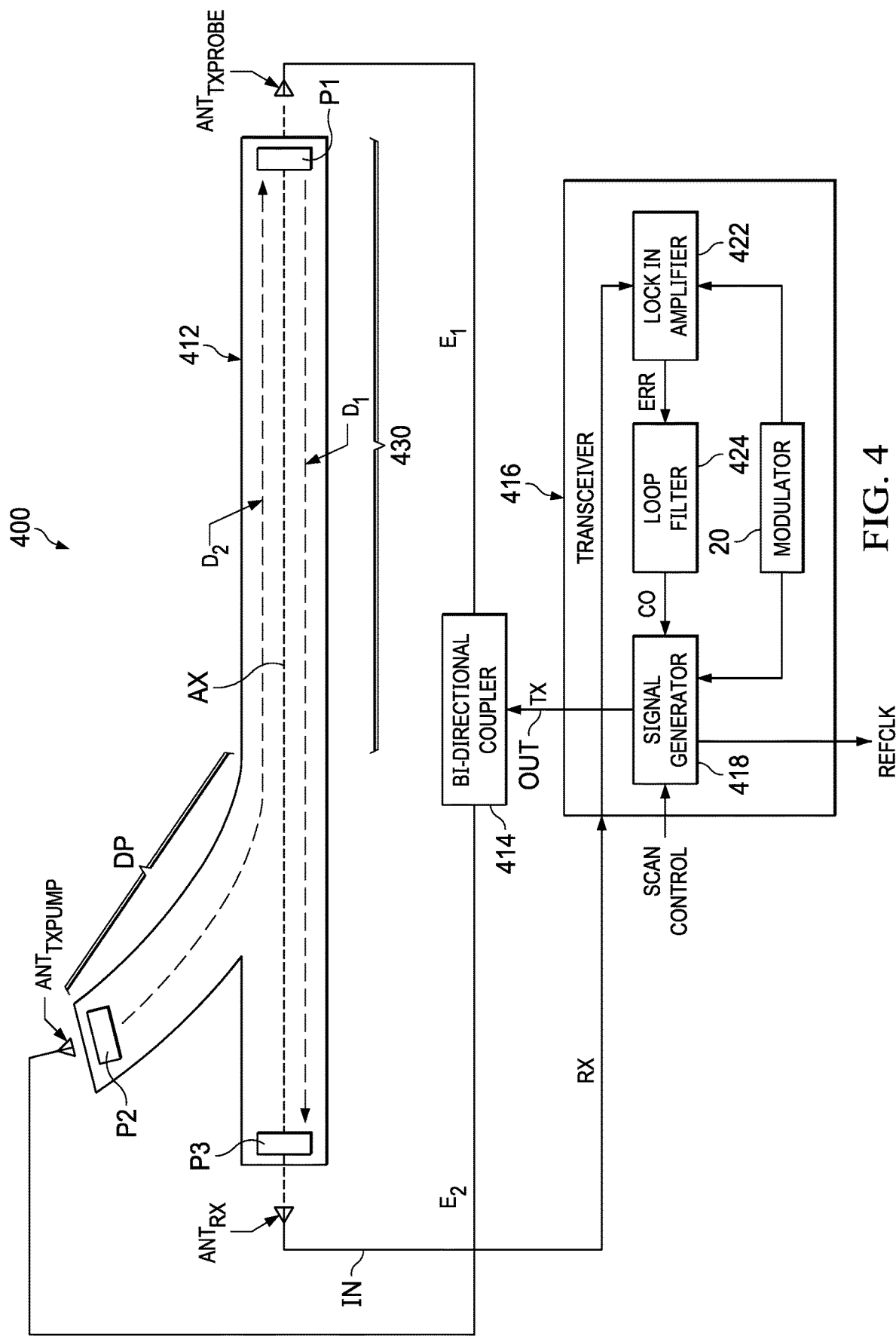
FIGS. 4-8 are block diagrams of example magnetic sensors that use various configurations of spectroscopic cells.

FIG. 4 is a block diagram of an example spectroscopic cell system 400 that can be operated as a magnetic sensor. Spectroscopic cell system 400 is described in more detail in U.S. Patent Application Publication No. 2019/0204786 (publication '786), entitled "Molecular Atomic Clock with Wave Propagating Rotational Spectroscopic Cell," which is incorporated by reference herein. System 400 includes three components, which are: a gas cell 412, a bidirectional coupler 414, and a transceiver 416. In an atomic clock mode of operation, transceiver 416 provides a stable reference clock signal REFCLK in response to bidirectional electromagnetic interrogation of a dipolar gas in cell 412.

In this example, cell 412 is formed in connection with an integrated circuit wafer, which can include multiple layers affixed relative to a semiconductor substrate (see, e.g., the incorporated by reference U.S. Pat. No. 9,529,334). In the illustration of FIG. 4, as in various subsequent drawings, the shape of cell 412 depicts a generally top-down view, such as a planar cross-sectional view parallel to the plane generally defined by the substrate in which the gas storage cavity of cell 412 is formed. Generally, cell 412 includes a sealed enclosure having an interior in which a gas is stored. More specifically, cell 412 stores a dipolar gas, such as water vapor ($H_2O$), $CH_3CN$, $HC_3N$, OCS, HCN, $NH_3$, and isotopes of these gases, or any other dipolar molecular gas, inside an enclosed cavity of the cell. The cavity is sealed by nature of shapes, layering, and the like relative to the semiconductor substrate and layers that combine to enclose the dipolar gas at a relatively low (e.g., 0.1 mbar) pressure. Cell 412 also includes, or is lined along most of its interior surfaces with, a material to facilitate the interior as a signal waveguide. Examples of such material include a conductor or a dielectric. Cell 412 includes a majority longitudinal length 430 having a linear axis AX, along which electromagnetic waves may travel, where the cross-sectional shape of cell 412 perpendicular to axis AX may be square, rectangular, trapezoidal, or other shapes. The dimensions of cell 412 may vary, such as 30 to 150 mm long, 30 to 50 mm wide, and 0.5 millimeter tall, where selecting these or comparable sizes would preferably match properties for efficient wave propagation according to the frequency of the desired wave. Moreover, while the longitudinal shape is linear in FIG. 4, in other examples it may bend or turn to form, such as a meandering path. In various embodiments, cell 412 includes an additional cavity portion that departs away from the linear portion of axis AX, where in FIG. 4 this non-coaxial or non-co-linear departure is shown generally at DP.

Bidirectional coupler 414 provides structure for propagating electromagnetic waves in both directions along axis AX of cell 412. Coupler 414 is connected to a probe antenna ANTTXPROBE and to a pump antenna ANTTXPUMP. Probe antenna ANTTXPROBE is positioned proximate a first passage P1 of cell 412, so electromagnetic energy from coupler 414 may be communicated to probe antenna ANTTXPROBE and then into first passage P1 as an entrance into cell 412, and thereby to pass generally in a first direction D1 shown by a dashed arrow in FIG. 4. In the context of first passage P1, the term "passage" means a signal communications pathway for passage of the electromagnetic signal, but not an open aperture to ambient per se that otherwise could cause the sealed dipolar gas in cell 412 to escape. Accordingly, such a pathway may be formed in various ways, such as by a glass layer as the upper surface of the sealed enclosure of the cell and providing an opening in the metal surround that is otherwise formed within the cell. In that way, an electromagnetic signal may pass through the opening and glass into the interior of the cell, thereby reaching the dipolar gas sealed therein. Pump antenna ANTTXPUMP is positioned proximate a second passage P2 of cell 412, so electromagnetic energy from coupler 414 may be communicated to pump antenna ANTTXPUMP and then into second passage P2 as an entrance into cell 412 and thereby to pass generally in a second direction D2, also shown by a dashed arrow in FIG. 4. Accordingly, for a majority 430 of the length along axis AX, the signals communicated by coupler 414 provide bidirectional interrogation of the dipolar gas in cell 412.

Transceiver 416, as its name suggests, is both for transmitting (TX) and receiving (RX) signals. Internally within transceiver 416, FIG. 4 shows signal generator 418, modulator 420, lock-in amplifier 422, and loop filter 424, for accomplishing the transceiver and signal responsiveness described herein. Transceiver 416 operates in a similar manner as transceiver 120 (FIG. 1A).

In a first example mode of operation, spectroscopy cell system 400 may be operated as an atomic clock, so long as it operates without ambient magnet field or operates with a suitable shield to isolate spectroscopic cell 412 from an ambient magnetic field, as described in more detail in publication '786.

In a second example mode of operation, spectroscopy cell system 400 may be operated as a magnetic sensor using the Zeeman effect, by scanning the frequency of the transmitted mm-wave signal and detecting two different absorption peaks, as described hereinabove in more detail. In this case, bidirectional coupler 414 may be locked to cause output signal OUT to be transmitted only from one antenna, such as antenna ANTTXPROBE. In this case, pump antenna ANTTXPUMP is ignored.

In another example, output signal OUT is transmitted from both antennas ANTTXPROBE and ANTTXPUMP to form a Doppler free mode of operation that substantially increases SNR.

Figure 5:
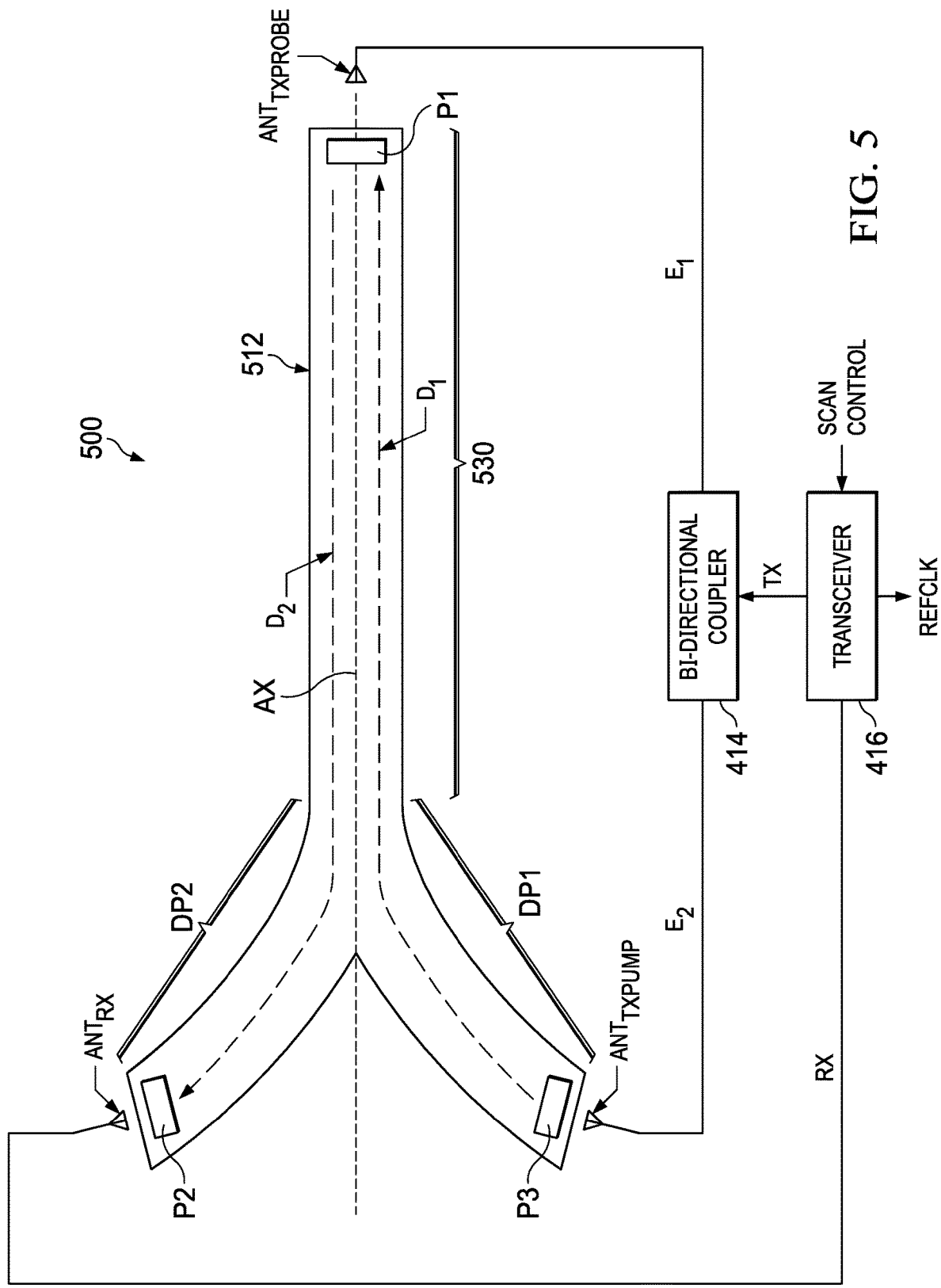

FIG. 5 is a schematic diagram of an alternative example system 500 that is configured to operate as magnetic sensor using the Zeeman effect. In some examples, system 500 may be configured to operate in a second mode as an atomic clock, so long as it operates without ambient magnet field or operates with a suitable shield to isolate spectroscopic cell 512 from an ambient magnetic field, as described in more detail in publication '786.

In this example, system 500 differs from system 400 (FIG. 4), because cell 512 is symmetric about its axis AX, and it includes a longitudinal cavity across a majority 530 of its overall length, but it has equally shaped and sized departure cavity portions DP1 and DP2, each with a respective passage P3 and P2, for communicating respective electromagnetic signals between cell 512 and the pump antenna ANTTXPUMP and receive antenna ANTRX, respectively. The majority length 530 of cavity 512 supports an area where the pump and probe signal coexist, and where molecules are detected and contribute to the strength of the signal. Accordingly, as this section becomes longer, the signal becomes larger, thereby contributing to a better SNR.

Figure 6:
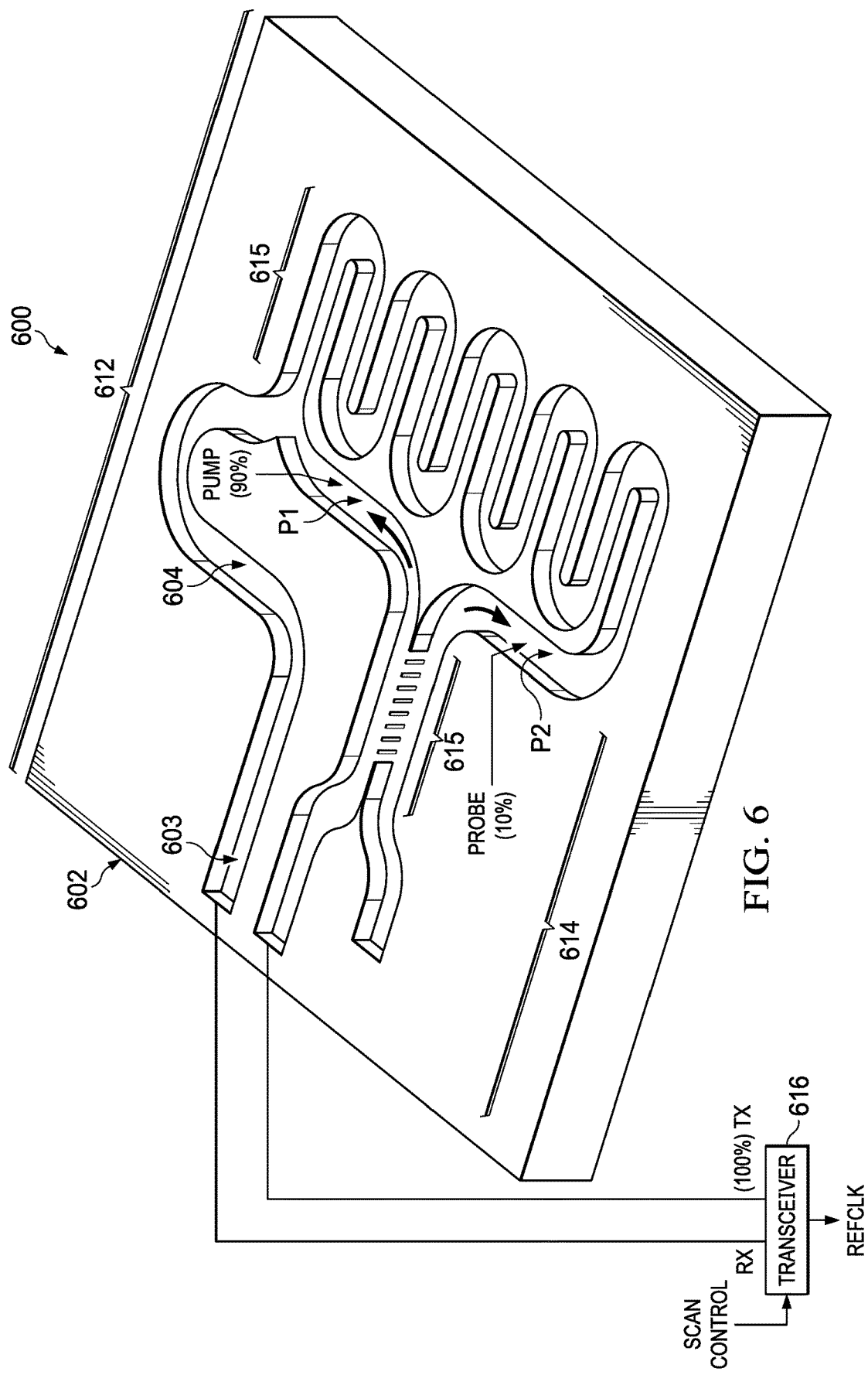

FIG. 6 is a schematic diagram of an alternative example system 600 that is configured to operate as magnetic sensor using the Zeeman effect. In some examples, system 600 may be configured to operate in a second mode as an atomic clock, so long as it operates without ambient magnet field or operates with a suitable shield to isolate spectroscopic cell 512 from an ambient magnetic field, as described in more detail in publication '786.

In this example, a channel 604 is formed as a recessed path in a substrate 602, so channel 604 includes portions that are comparable in certain respects to cell 412 of FIG. 4. In this example, cell 612 and transceiver 616 (similar to transceiver 416 of FIG. 4) are monolithically integrated into a same layer in substrate 602 (e.g., co-planar). Particularly, channel 604 includes various portions, which are generally indicated with brackets to illustrate functionality. But in the illustrated example, the entire channel 604 functions as a gas cell, which is a sealed enclosure for storing atoms to be interrogated by an electromagnetic wave. In this regard, while not shown, an additional layer (e.g., glass) is disposed atop an upper surface of substrate 602, thereby enclosing the sealed gas, while also allowing receipt of a TX signal from transceiver 616 and providing a path for wave propagation, after which the signal provides an RX signal back to transceiver 616. In one portion of channel 604 shown generally by the bracket 614, two proximate wave paths P1 and P2 are in fluid communication with one another, with a sidewall aperture coupler 615 portion in which a number of apertures are formed between the two paths. In this manner, as TX energy enters channel 604, a first portion (e.g., pump at 90%) of that energy passes through path P1, and the remaining portion (e.g., probe at 10%) of that energy passes through the apertures in sidewall aperture coupler 615 and then through path P2. Paths P1 and P2 continue to, and are also in fluid communication with, opposing ends of a meandering cell portion 615. Accordingly, in cell portion 615, as in examples described above, bidirectional interrogation occurs as the pump wave passes in a first direction through portion 615, while the probe wave passes in a second direction (opposite the first direction) also through portion 615, thereby bidirectionally interrogating dipolar gas in portion 615. Finally, some of the energy of the propagating wave can pass from portion 615, back to transceiver 616, in the form of the RX signal from an end 603 of channel 604.

Figure 7:
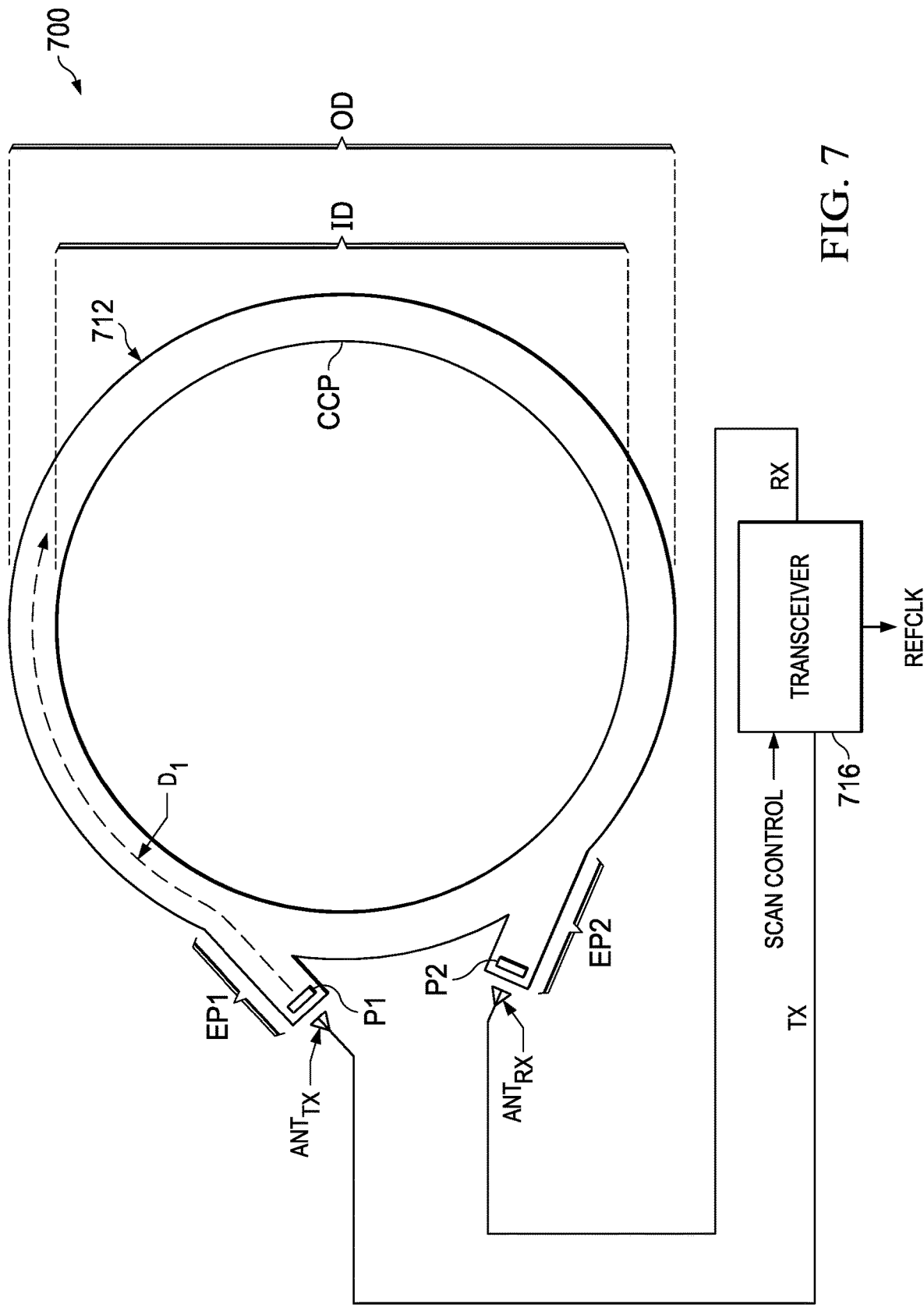

FIG. 7 is a schematic diagram of an another example system 700, which is configured to operate as magnetic sensor using the Zeeman effect, as described in more detail hereinabove with regards to FIGS. 1A, 1B, 2, and 3. In some examples, system 700 may be configured to operate in a second mode as an atomic clock, so long as it operates without ambient magnet field or operates with a suitable shield to isolate spectroscopic cell 712 from an ambient magnetic field, as described in more detail in publication '786.

A single transmit antenna ANTTX is proximate a passage P1, which is located in an extension portion EP1 of cell 712, where the extension portion fluidly communicates with a continuous chamber portion CCP. In this example, portion CCP has a circular cross-section taken along a plane of wave travel and has a middle diameter $D_m$, according to expression (4). In this example, diameter $D_m$ is a middle diameter halfway between the inner diameter ID and the outer diameter OD, $\lambda_g$ is the wavelength of the electromagnetic wave launched by transmit signal TX within cell 712, and N is an integer number of one or greater.

$$D_m = \frac{N\lambda_g}{\pi} \qquad (4)$$

As a result, an electromagnetic signal transmitted from antenna ANTTX, via passage P1 into cell 712, propagates as a wave along the interior of extension portion EP1 in a direction D1, and it continues into continuous chamber portion CCP, so direction D1 thereby can be characterized as clockwise in this example. Moreover, because of the continuous nature of portion CCP, and further contributed by the dimension of its middle diameter defined by expression (4), the wave will circulate in a constructive manner in cell 712, thereby interrogating an ample amount of dipolar gas in the process. Such a result is achieved even though the path of the electromagnetic wave is omnidirectional, in contrast to the bidirectional signal travel in various examples described above. Accordingly, the response of such interrogation will have an improved SNR as received by transceiver 716, via the exit extension portion EP2, passage P2, and receive antenna ANTRX.

Figure 8:
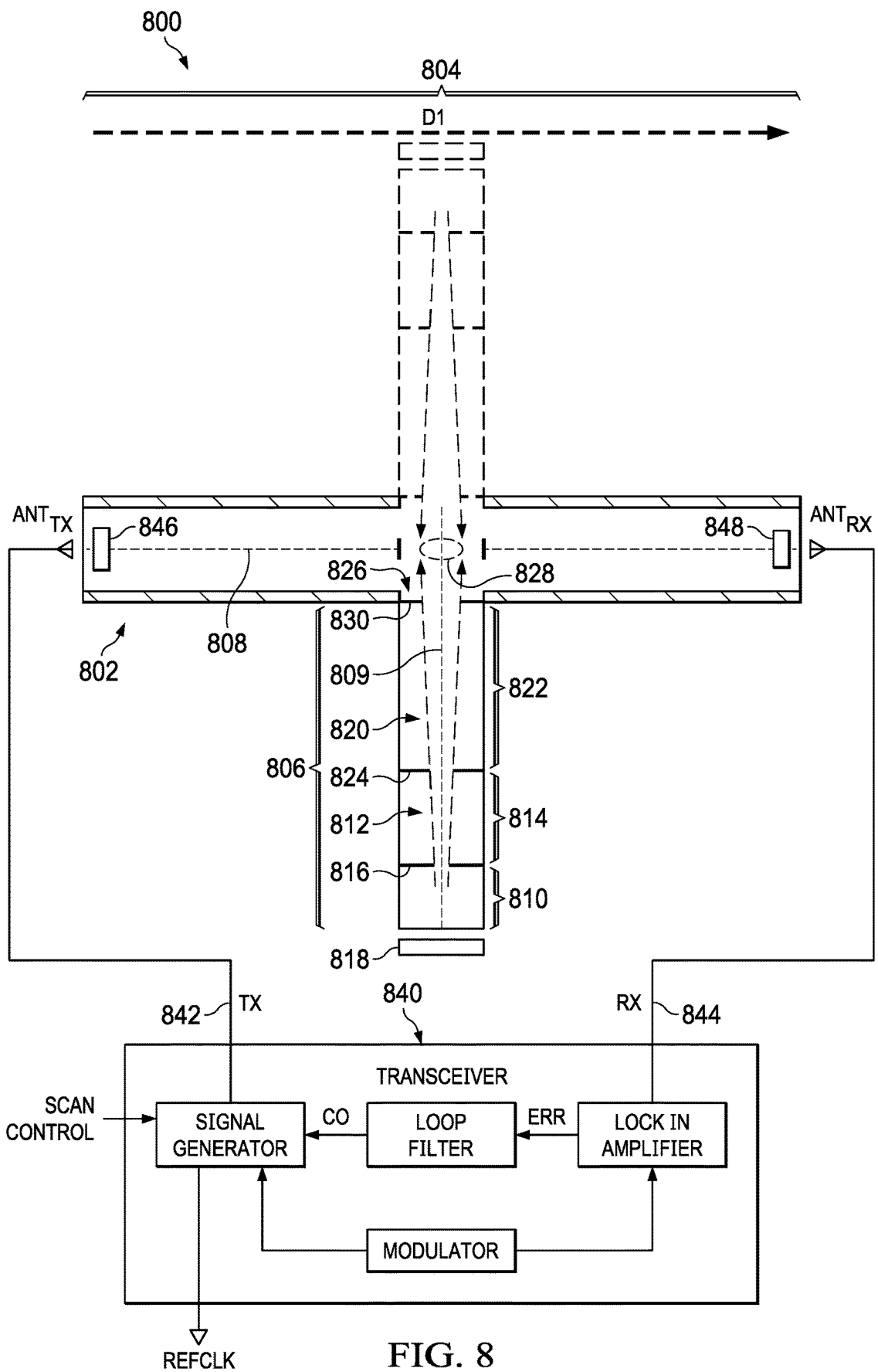

FIG. 8 is a schematic diagram of an example system 800 that is configured to operate as magnetic sensor using the Zeeman effect, as described in more detail hereinabove with regards to FIGS. 1A, 1B, 2, and 3. In some examples, system 800 may be configured to operate in a second mode as an atomic clock, so long as it operates without ambient magnet field or operates with a suitable shield to isolate spectroscopic cell 812 from an ambient magnetic field, as described in more detail in U.S. Patent Application Publication No. 2019/0204788, entitled "Molecular Atomic Clock With Wave Propagating Rotational Spectroscopy Cell," which is incorporated by reference herein.

System 800 includes a cell 802 coupled to a transceiver 840, which operates in a similar manner to transceiver 116 in FIG. 1A. Cell 802 includes two different chambers 804 and 806 in fluid communication with each other, and each of chambers 804 and 806 has a respective axis 808 and 809 along the respective majority length of the chamber.

Chamber 806 includes a reservoir 810, in which dipolar gas is located, although fluid communication within cell 802 permits such gas to be distributed throughout cell 802. Reservoir 810 is physically bounded in most respects by the boundary of chamber 806 (e.g., sidewalls, top, bottom, and end wall), while one portion of reservoir 810 includes, or fluidly communicates with, a first velocity direction filter 812. Velocity direction filter 812 filters atoms from among the atoms of the dipolar gas situated in reservoir 810. The filtered (selected) atoms are those having a velocity vector direction aligned, or more closely aligned, with axis 809, relative to other atoms in reservoir 810, and those filter atoms are effectively directed toward an adjacent reservoir 814. In the illustrated example, velocity direction filter 812 is achieved by forming an aperture in a first wall 816 within chamber 806, where the size might vary based on various considerations. For example, the aperture (e.g., diameter) of velocity direction filter 812 may be on the order of 8 mm or less than 1 mm (e.g., 200 µm or less). The exact size of the aperture will be sufficient for enough molecules to propagate and reach chamber 804, in order to maximize the signal-to-noise ratio (SNR), but also to narrow the distribution of velocities of the molecules, so velocity vector direction is aligned, or more closely aligned, with axis 809. Also, a symmetric structure on the opposite wall of chamber 804 can maintain phase uniformity, as shown in FIG. 8 with a dashed outer boundary. An asymmetric structure is also possible yet, in such an example, the design dimensions would preferably be shifted, such as by a factor of $\lambda g/8$, where $\lambda g$ is the wavelength in chamber 804. Further, chamber 806 may have differing dimensions from chamber 804, because chamber 806 is configured to direct certain atoms into chamber 804, while chamber 804 is configured to propagate waves. Accordingly, the wave-propagating considerations in the dimensions of chamber 804 do not necessarily apply to chamber 806. Thus, for example, chamber 806 may be taller (e.g., greater than 1 mm) to support sufficient structure for the apertures described herein. Also, in connection with advancing atoms through velocity direction filter 812, a heating (or other external energizing) block 818 is located proximate reservoir 810. In one example, heating block 818 includes one or more devices for applying heat to reservoir 810. For example, block 818 may include a heating element (e.g., a resistor, laser, or the like), a controller for applying energy (e.g., current) to the heating element, and additional structure (e.g., feedback loop and thermometer/thermistor) to keep the temperature of reservoir 810 stable or otherwise within some range.

Dipolar gas is also located in reservoir 814. But due to its fluid communication with reservoir 810 and velocity direction filter 812 between the two reservoirs, reservoir 814 stores a greater concentration of atoms having a velocity vector direction aligned with axis 809, relative to the velocity distribution of atoms in reservoir 810. Dipolar gas is also located in reservoir 822. But due to its fluid communication with reservoir 814 and velocity direction filter 820 between the two reservoirs, reservoir 822 stores a greater concentration of atoms having a velocity vector direction aligned with axis 809, relative to the velocity distribution of atoms in reservoir 814. Reservoirs 814 and 822 are akin to reservoir 810, physically bounded by parts of the boundary of chamber 806, while part of reservoir 822 also includes (or fluidly communicates with) a third velocity direction filter 826, thereby separating reservoir 822 from a region 828 (shown by a dashed oval in FIG. 8) that fluidly communicates with the wave propagation path along direction D1 and axis 808. Like velocity direction filters 814 and 820, velocity direction filter 826 also filters atoms according to velocity vector direction, but filter 826 does so from among the atoms of the dipolar gas situated in reservoir 822 and using a comparable structure as filters 814 and 820, such as by forming an aperture in a third wall 830 within chamber 806. In a preferred example, third wall 830 is aligned with (or closely proximate to) the longitudinal wall of chamber 804, to reduce any effect that cavity 806 might have to wave propagation through cavity 804. Further, the aperture of velocity direction filter 826 may be the same as that of filters 812 and 820 (on the order of 1 mm), or it may be slightly larger to adjust the columnar molecular beam that is achieved by way of successive filters, each preferably having a respective center concentrically aligned along axis 809.

The successive filtering causes the velocity vector alignment of those atoms in region 828 to be generally much more consistently aligned, or nearly aligned, relative to axis 809. Accordingly, the achieved velocity vector population is preferably aligned as near as possible to axis 809 and no longer has an isotropic direction distribution such as in reservoir 810, but achieving such an alignment (via filters 812, 820, and 826) will reduce the number of molecules that are interrogated in region 828, thereby also reducing SNR. Thus, a tradeoff exists between filtering the molecules to align or nearly-align with axis 809 while still advancing a sufficient number of molecules to region 828, to provide a sufficient SNR. Filtering of the molecules results in a general directionality of the velocity vectors of molecules in region 828, to be perpendicular or near-perpendicular (e.g., within ±45 degrees, or even ±30 degrees or less) to the direction D1 along which the electromagnetic wave EMW propagates through chamber 804.

Figure 9:
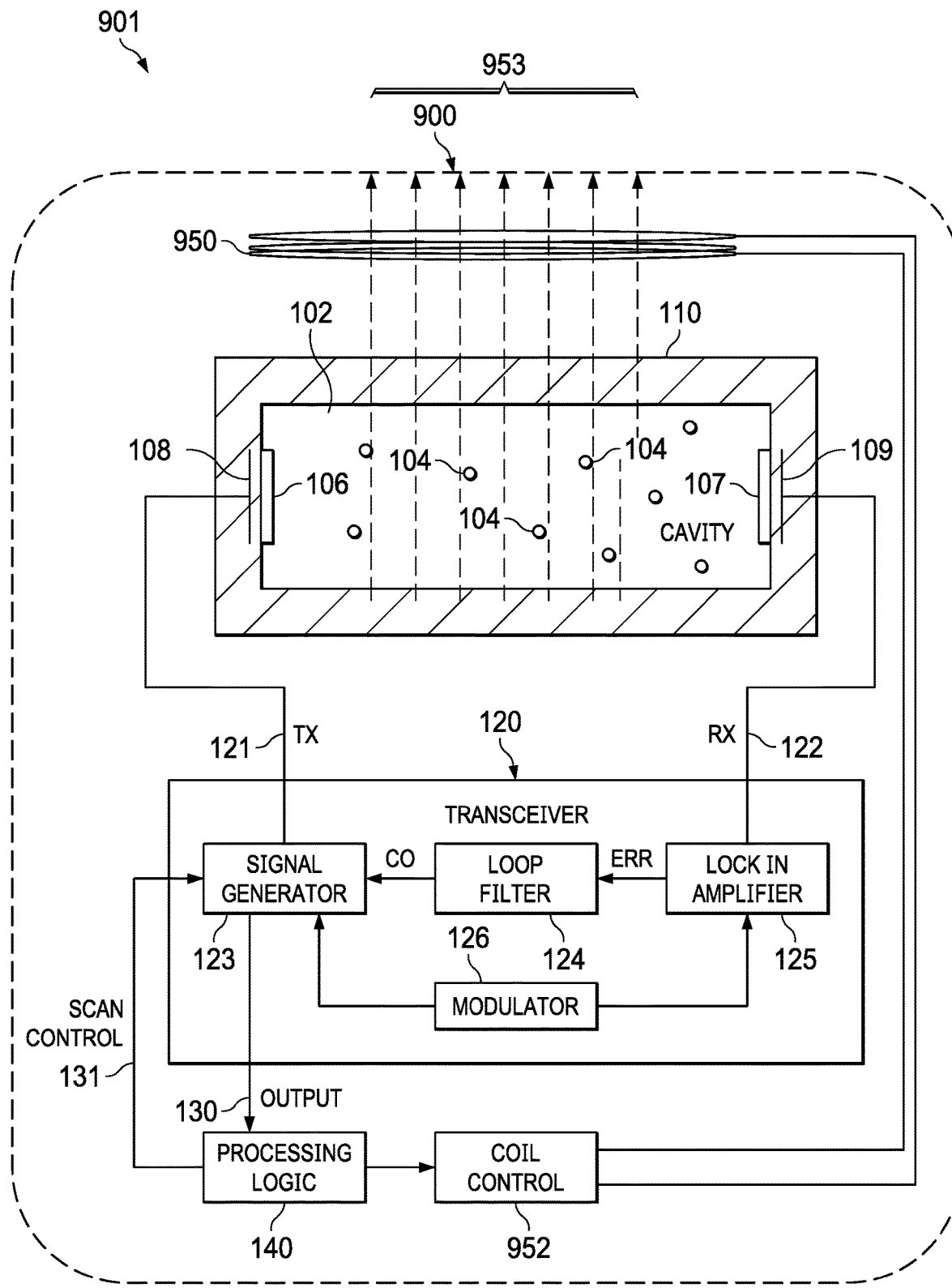
FIG. 9 illustrates an example integrated circuit that includes a hermetically sealed chip-scale magnetic sensor having an external field coil.

FIG. 9 illustrates an example magnetic sensor 900 that is fabricated on integrated circuit 901. Magnetic sensor 900 is similar to magnetic sensor 100 of FIG. 1A, but includes an example external field coil 950. In this example, coil 950 is positioned on a top surface of magnetic sensor 900. The orientation of the coil is just an example, as any orientation of the coil is suitable if it provides a uniform magnetic field inside the cavity. To more accurately define the position of the minimum of the dip, such as peak 311, 312 in FIG. 3, it helps to know the "background curve" where the dip is located. Subtracting this background exposes exactly where the Zeeman dips are located. This challenge is compounded because the background could change with temperature, and other environmental factors could induce a "fake" shift of the position of the dips, thereby leading to an error in the magnetic field measurement. One way to deal with this challenge is to use an auxiliary magnetic field generated by an external coil to split the peak using Zeeman effect, and in that way expose and record the background curve. This method is useful with the magnetometer to more accurately detect how the dips interact with the external field and to move the dips in response to the auxiliary magnetic field to determine the background curve. After determining the background response, this magnitude is subtracted from the signal that is obtained when measuring an external magnetic field, as indicated by a measured amount of Zeeman frequency shift, such as frequency shift 315 in FIG. 3. In this manner, the accuracy of detecting a magnitude of a target magnetic field is improved.

IC 900 is similar to IC 100, but with the addition of coil 950 and coil control logic 952. Coil 950 is configured to induce an auxiliary magnetic field 953 that impinges on spectroscopy device 110 in response to a current provided by coil control logic 952. Calibration and control instructions performed by processing logic 140 are used control the amount of current sent to coil 950, in order to generate the auxiliary magnetic field and thereby control the magnitude of the auxiliary magnetic field.

In this example, coil 950 is implemented by patterning one or more conductive layers that are positioned on top of spectroscopic device 110. In another example, a discrete coil or other known or later developed techniques for generating a controllable auxiliary magnet field may be used.

Figure 10A:
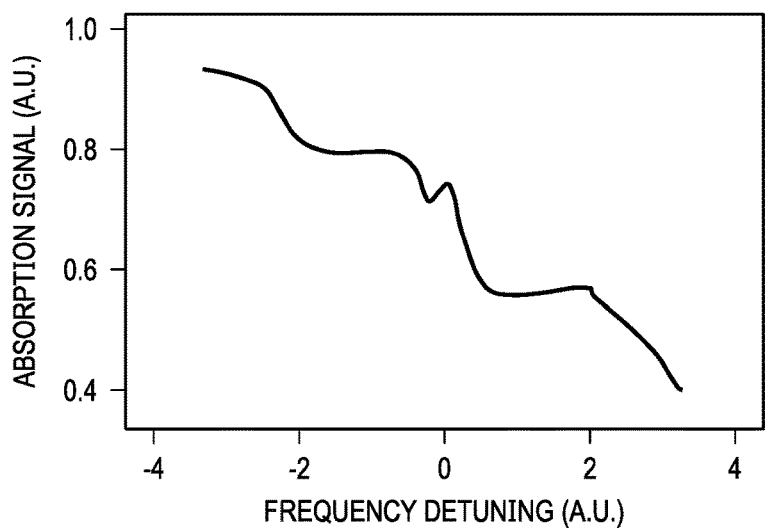
FIGS. 10A-10E are plots illustrating a technique to compensate for interference from a background field.

FIGS. 10A-10E are plots illustrating a technique to compensate for interference from a background field. Plot line 1001 in FIG. 10A represents an example ambient background signal that is detected by magnetic sensor 900. Ambient background signal 1001 does not necessarily depend on an ambient magnetic field, but could depend on interference from nearby electronics, temperature, intrinsic effects of the IC package, the interface between the IC package and silicon 901, etc. Plot line 1001 could be the signal if no gas exists in cavity 102, for example.

Figure 10B:
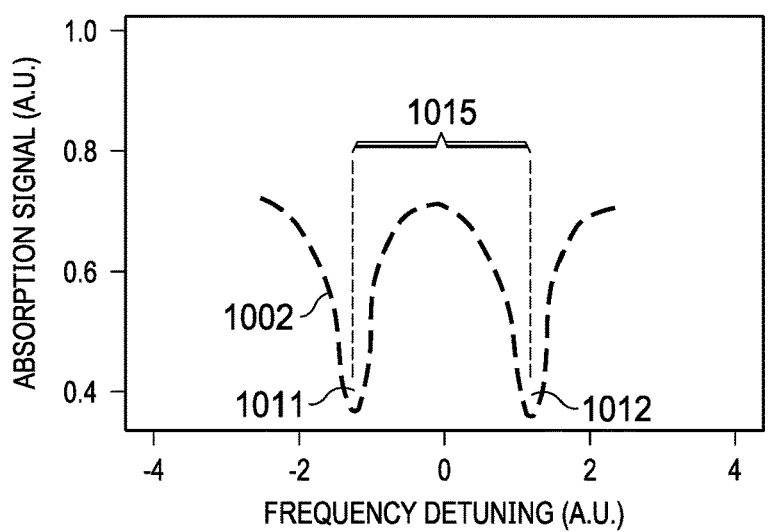

Plot line 1002 in FIG. 10B represents the expected Zeeman effect signal that would be detected in the presence of a target magnetic field, as described in more detail for plot line 302 in FIG. 3. A frequency shift 1015 between two absorption peaks 1011 and 1012 is indicative of the magnitude of a target magnetic field that is sensed by magnetic sensor 900.

Figure 10C:
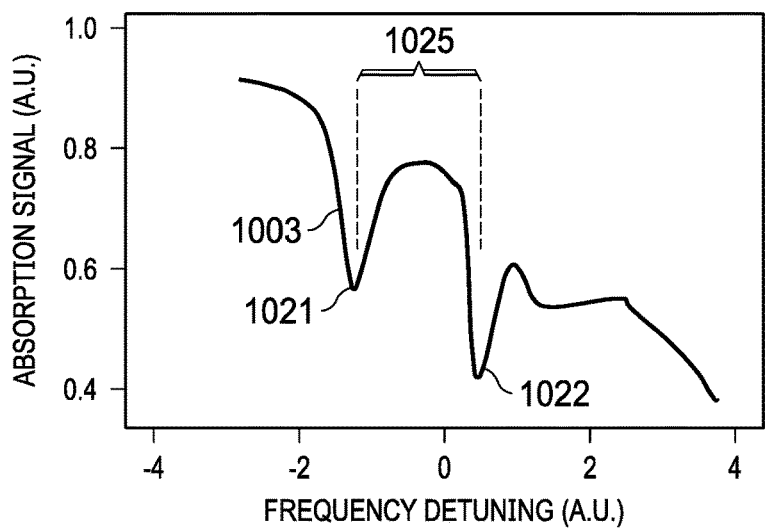

Plot line 1003 in FIG. 10C represents a combined signal that is detected for a target magnetic field in the presence of background signal 1001. The frequency shift 1025 between peak 1021 and 1022 is distorted due to background effect, as compared to the expected frequency shift 1015 in FIG. 10B.

Figure 10D:
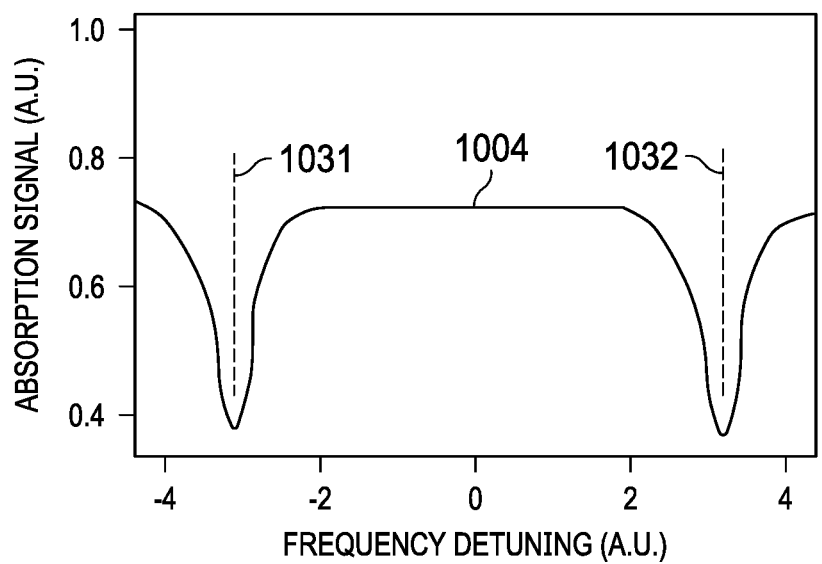

In FIG. 10D, an auxiliary magnetic field is applied to magnetic sensor 900 by coil 950 responsive to coil control logic 952. Ignoring the background signal for the moment, the Zeeman response for the auxiliary magnetic field is represented by response 1004. The auxiliary magnetic field's strength is controlled to be large enough to move detected absorption peaks 1031, 1032 away from that expected absorption peaks for the target magnetic field.

Figure 10E:
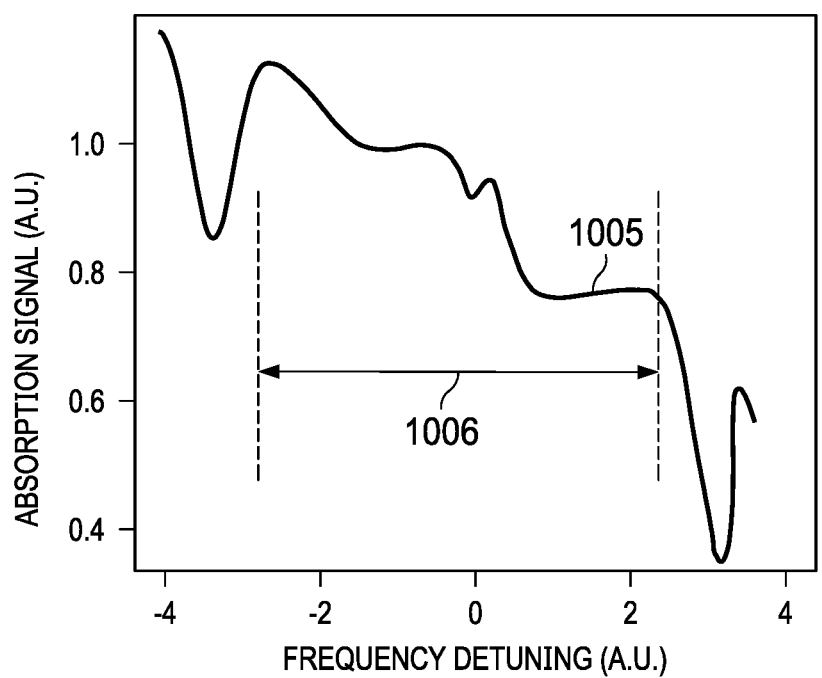

Plot line 1005 in FIG. 10E represents a detected signal that is a combination of background signal 1001 and auxiliary magnetic field response 1004. As shown, a portion 1006 between the absorption peaks produced by the auxiliary magnetic field of plot line 1005 is representative of background signal 1001.

Portion 1006 of plot line 1005 can therefore be saved and used as a correction signal for a measured response when a target magnetic field is present. For example, referring to FIG. 10C, a saved background correction signal portion 1006 of plot line 1005 may be subtracted from combined signal 1003 to produce a more accurate representation of a target magnetic field, as shown in FIG. 10B by plot line 1002.

A calibration sequence may be performed to produce a new background correction signal in a periodic manner, in order to compensate for changes in temperature and other ambient effects that may change over time. For example, a calibration sequence may be initiated each time a magnetic sensor is powered on. In another example, a calibration procedure may be performed before exposing the magnetic sensor to a target magnetic field.

Figure 11:
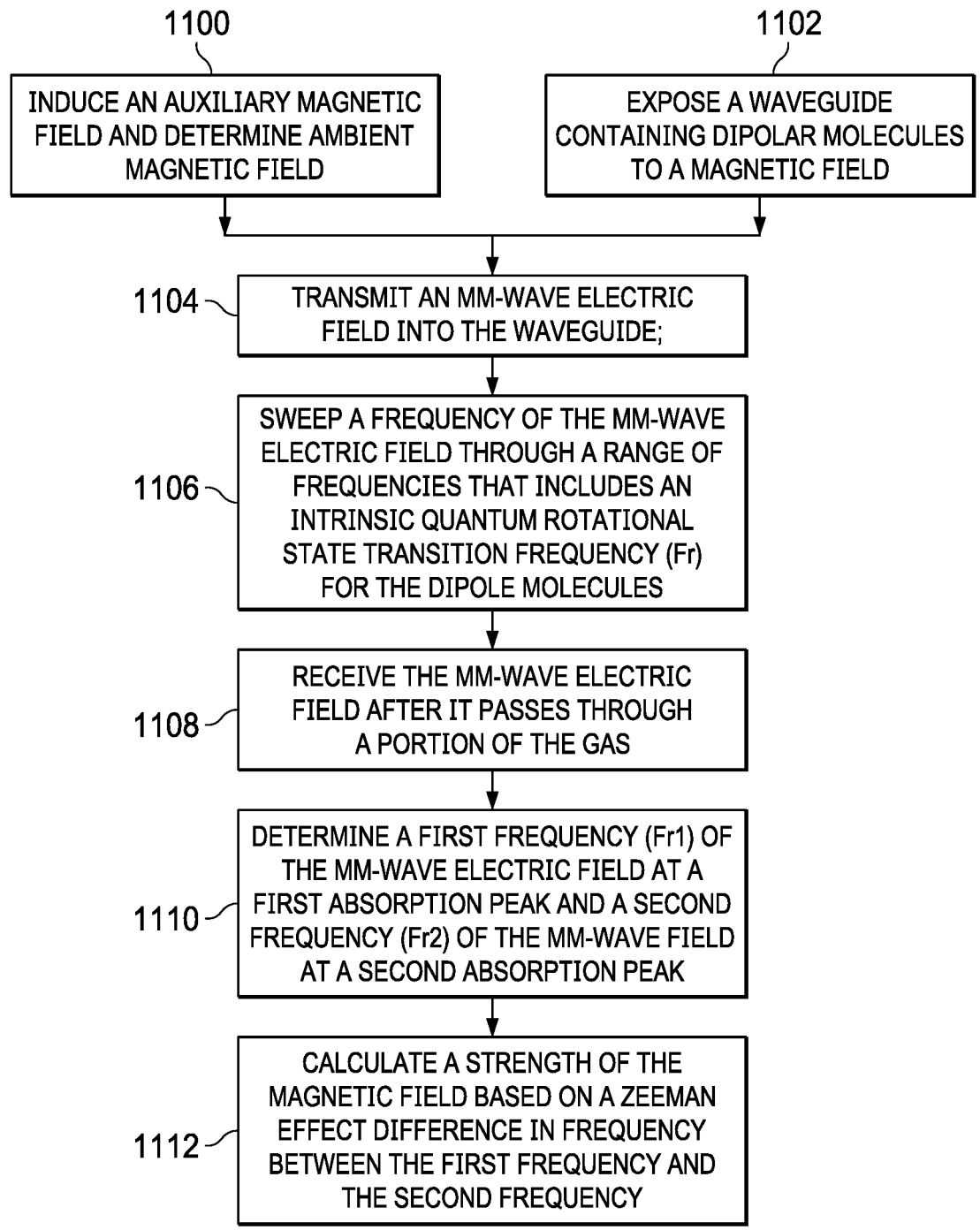
FIG. 11 is a flow diagram of operation of a Zeeman effect magnetic sensor.

FIG. 11 is a flow diagram illustrating operation of a Zeeman effect mm-wave magnetic sensor. In examples described herein with reference to FIGS. 1A, 1B and 2-9, various example systems are configured to operate as a spectroscopic cell-based mm-wave magnetic sensor using the Zeeman effect. In some examples, the system may be configured to operate in a second mode as an atomic clock, so long as it operates without ambient magnet field or operates with a suitable shield to isolate the spectroscopic cell from an ambient magnetic field.

In some examples, at 1100, an auxiliary field is induced that affects entirely the waveguide that forms the spectroscopic cell, such as described with reference to FIG. 9. The auxiliary field is controlled to separate the Zeeman peaks enough to expose and record the background response, and to account for the variability this background could impose on the real position of the Zeeman peaks when the auxiliary field is turned off and a magnetic measurement is performed. This step may be repeated periodically to maintain an accurate estimate of the background response over a range of time and temperature. Steps 1106, 1108, 1110, and 1112 are performed while the auxiliary field is applied to determine background response. The strength of the auxiliary field is varied over a range of field strengths, up to a maximum field strength that the magnetometer is designed to measure, in order to determine the background response curve for the magnetometer. After the background correction curve is determined, the auxiliary magnetic field is removed. During ongoing operation, an updated background correction signal may be measured before a magnetic field measurement is performed. After the background correction curve is estimated, the magnetometer is ready to perform an external magnetic field measurement at 1102. The recorded background response is then subtracted from a measured magnetic field to improve the accuracy of the target magnetic field measurement.

At 1102, the waveguide within the magnetic sensor is exposed to a magnetic field. As described hereinabove, the waveguide encapsulates a gas that includes dipolar molecules, such as water vapor.

At 1104, a mm-wave electric field is transmitted into the waveguide. The frequency of the mm-wave electric field is selected to be in a range that includes the intrinsic quantum rotational state transition frequency for the dipolar gas that is encapsulated within the waveguide. For example, for water molecules, the intrinsic quantum rotational state transition frequency (Fr) is 183.31 GHz. The intrinsic quantum rotational state transition frequency for some other example dipolar molecules is listed in Table 1 under "natural frequency."

At 1106, the frequency of the mm-wave electric field is swept through a range of frequencies that includes the intrinsic quantum rotational state transition frequency (Fr) for the dipolar molecules that are encapsulated within the waveguide. In this example, the range of frequencies is selected from a range of 10-50 MHz around Fr.

At 1108, the mm-wave electric field is received after it passes through a portion of the gas. The waveguide may be straight, as illustrated in FIG. 1A, so the mm-wave electric field passes through all or most of the gas encapsulated within the waveguide. In other examples, such as illustrated in FIGS. 4 and 5, the waveguide may have regions through which the mm-wave electric field does not pass.

In another example, such as illustrated in FIG. 6, the mm-wave electric field may follow a serpentine or circuitous route through a non-linear waveguide.

As described hereinabove for FIG. 1A, in some examples, the mm-wave field makes just one pass through the waveguide. In some other examples, the waveguide is configured to allow the mm-wave field to make more than one pass through the gas, such as illustrated in FIG. 7. SNR may be improved when the mm-wave makes multiple passes through the gas.

At 1110, a first frequency (Fr1) of the mm-wave electric field at a first absorption peak is determined, and a second frequency (Fr2) of the mm-wave field at a second absorption peak is determined. In the described examples, this is done by the transceiver locking onto the frequency where the absorption peaks occur during the frequency sweep described at 1106.

At 1112, a strength of the target magnetic field is calculated based on a Zeeman effect difference in frequency between the first frequency and the second frequency. As illustrated in FIG. 3, a difference between an absorption peak frequency Fr when no magnetic field is present and an absorption peak frequency Fr1 when a magnet field is present is proportional to the strength of the target magnetic field that is present at the spectroscopy cavity. Similarly, the amount of separation between the first absorption peak frequency Fr1 and the second absorption peak frequency Fr2 is also proportional to the strength of a magnetic field that is present at the spectroscopy cavity.

For examples in which a magnitude of an ambient magnetic field is determined at 1100, the background correction signal is subtracted from the magnetic field strength determined by the amount of separation between Fr1 and Fr2 to produce a more accurate value for the target magnetic field.

A calibration process may be performed to determine the proportionality between the difference in absorption peak frequencies and the strength of a magnetic field that is applied to the waveguide.

Thus, a system includes a mm-wave magnetic field sensor that can provide magnetic field sensitivity well below 1 nT by selecting appropriate gases and using methods to increase the sensitivity of the device, such as Doppler-free implementations described hereinabove. Such systems are useful for medical imaging and examination as an alternative to MM (magnetic resonance imaging) for body and/or brain scans, due to its high sensitivity. Low cost components are useful for wheel speed detection in automotive, trucking, and industrial applications. Ruggedized systems are useful for applications such as undersea exploration. Other uses include inspection of packages, materials, etc.

A magnetic sensor (based on quantum molecular transitions as described hereinabove) is very insensitive to environmental factors (such as temperature, stress, aging, etc.) that could be a problem for other devices, where the results depend on material properties that change with temperature and stress.

OTHER EMBODIMENTS

In described examples, a single mm-wave magnetic sensor is illustrated. In another example, an array of sensors may be used to detect variations in a magnetic field.

In the examples described herein, dipolar water vapor molecules ($H_2O$) are encapsulated within the spectroscopic cell. In other examples, dipolar gases (such as $CH_3CN$, $HC_3N$, OCS, HCN, $NH_3$, and isotopes of these gases, or any other dipolar molecular gas) may be placed inside an enclosed cavity of the cell for interrogation by a mm-wave electromagnetic field to determine a Zeeman response in the presence of a magnetic field.

In described examples, the cross-sectional shape of a cell perpendicular to axis may be square, rectangular, trapezoidal, or various other shapes. The dimensions of the cell may vary, where the cell size is selected to match properties for efficient wave propagation of the desired wave's frequency according to the selected encapsulated dipolar molecules.

In described examples, the absorption peaks coincide with a maximum amount of absorption of the absorption signal resulting in minima peaks in the absorption signal. In another example, the absorption peaks coincide with a minimum amount of absorption of the absorption signal resulting in maximal peaks in the absorption signal.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. A method of operating a magnetic sensor, the method comprising:
   exposing a waveguide within the magnetic sensor to a magnetic field, wherein the waveguide encapsulates a gas that includes dipolar molecules;
   transmitting a mm-wave electric field into the waveguide;
   sweeping a frequency of the mm-wave electric field through a range of frequencies, wherein the range of frequencies includes an intrinsic quantum rotational state transition frequency (Fr) for the dipolar molecules;
   receiving the mm-wave electric field after it passes through a portion of the gas;
   determining a first quantum rotational state transition frequency (Fr1) of the mm-wave electric field at a first absorption peak and a second quantum rotational state transition frequency (Fr2) of the mm-wave electric field at a second absorption peak; and
   calculating a strength of the magnetic field based on a difference in frequency between Fr1 and Fr2.

2. The method of claim 1, wherein determining Fr1 and Fr2 includes determining Fr1 and Fr2 while the waveguide is exposed to the magnetic field.

3. The method of claim 1, wherein determining Fr1 includes determining Fr1 while the waveguide is not exposed to the magnetic field, and determining Fr2 includes determining Fr2 while the waveguide is exposed to the magnetic field.

4. The method of claim 1, further comprising:
   determining a strength of an ambient magnetic field that is acting on the waveguide; and
   calculating a strength of a target magnetic field by subtracting the strength of the ambient magnetic field from the calculated strength of the magnetic field.

5. The method of claim 1, further comprising:
   exposing the waveguide to an auxiliary magnetic field in addition to a background field, wherein the auxiliary magnetic field has a strength that is greater than an expected strength of a target magnetic field;
   determining a response curve for the auxiliary magnetic field between a third quantum rotational state transition frequency (Fr3) of the mm-wave electric field at a third absorption peak and a fourth quantum rotational state transition frequency (Fr4) of the mm-wave electric field at a fourth absorption peak for the auxiliary magnetic field; and
   selecting a portion of the response curve for the auxiliary magnetic field between Fr3 and Fr4 for use as ambient background correction signal.

6. The method of claim 5, further comprising:
   exposing the waveguide to a combined magnetic field that includes the target magnetic field and the ambient background field;
   determining a combined response curve for the mm-wave signal across the range of frequencies;
   subtracting the ambient background correction signal from the combined response curve to form a target response curve; and
   calculating a strength of the target magnetic field based on a difference in frequency between Fr1 and Fr2 according to the target response curve.

7. The method of claim 5, wherein a magnitude of the auxiliary magnetic field is greater than a maximum magnetic field strength that is sensible by the magnetic sensor.

8. The method of claim 1, wherein the absorption peak coincides with a maximum amount of absorption.

9. The method of claim 1 wherein the absorption peak coincides with a minimum amount of absorption.

10. The method of claim 3, further comprising operating the magnetic sensor as an atomic clock by providing an output signal responsive to the mm-wave electric field while the frequency of the mm-wave electric field is locked at Fr1.

11. The method of claim 1, wherein transmitting the mm-wave electric field is performed by one transmit antenna at a passage on the waveguide.

12. The method of claim 1, wherein transmitting the mm-wave electric field is performed by: transmitting a first portion of the mm-wave electric field from a first transmit antenna at a first passage of the waveguide, in which the first portion of the mm-wave electric field travels through a portion the waveguide in a first direction; and transmitting a second portion of the mm-wave electric field from a second transmit antenna at a second passage of the waveguide, in which the second portion of the mm-wave electric field travels through the portion of the waveguide in a second direction opposite the first direction.

13. The method of claim 1, wherein receiving the mm-wave electric field is performed by a receive antenna at a receive passage of the waveguide.

14. A magnetic sensor, comprising:
   a waveguide encapsulating a gas that includes dipolar molecules, the waveguide having a first passage and a second passage;
   a transmit antenna coupled to the first passage;
   a receiving antenna coupled to the second passage;
   a signal generator having an output and a control input, the output coupled to the transmit antenna, and the signal generator configured to provide a mm-wave signal to the transmit antenna responsive to the control input;
   control logic having an input and a control output, the input coupled to the receiving antenna, the control output coupled to the control input, and the control logic configured to:
   sweep a frequency of a mm-wave electric field through a range of frequencies, wherein the range of frequencies includes an intrinsic quantum rotational state transition frequency (Fr) for the dipolar molecules;
   determine a first quantum rotational state transition frequency (Fr1) of the mm-wave electric field at a first absorption peak and a second quantum rotational state transition frequency (Fr2) of the mm-wave electric field at a second absorption peak; and
   calculate a strength of a magnetic field passing through the waveguide based on a difference in frequency between Fr1 and Fr2.

15. The magnetic sensor of claim 14, wherein the dipolar gas is selected from a group consisting of $H_2O$, CO, SO2, O3, HCN, and DCN.

16. The magnetic sensor of claim 14, further comprising: a coil adjacent the waveguide; and coil control logic coupled to the coil, the coil configured to generate an auxiliary magnetic field that passes through the waveguide, and the coil control logic configured to control a magnitude of the auxiliary magnetic field.

17. The magnetic sensor of 14, wherein the waveguide has a third passage, the magnetic sensor further comprises a probe antenna coupled to the third passage, the output of the signal generator is coupled to the probe antenna, and the signal generator is configured to provide a portion of the mm-wave signal to the probe antenna via the output.

18. The magnetic sensor of claim 14, wherein the signal generator has a clock input, and the magnetic sensor further comprises a reference clock coupled to the clock input, and the control logic is configured to operate the magnetic sensor in a first mode as a magnetic field strength sensor and to operate the magnetic sensor in a second mode as an atomic clock.

19. The magnetic sensor of claim 14, further comprising an integrated circuit that includes the waveguide, the transmit antenna, the receive antenna, the signal generator, and the control logic.

20. The magnetic sensor of claim 14, wherein the waveguide has a non-linear shape.

* * * * *